(12) United States Patent
Bell et al.

(10) Patent No.: US 10,734,719 B1
(45) Date of Patent: Aug. 4, 2020

(54) LOW-PIM CHANNEL RUNNER ASSEMBLY AND CABLE SUPPORT RAIL SYSTEM

(71) Applicant: ConcealFab Corporation, Colorado Springs, CO (US)

(72) Inventors: Thomas Bell, Colorado Springs, CO (US); Steve Rogers, Colorado Springs, CO (US)

(73) Assignee: ConcealFab Corporation, Colorado Springs, CO (US)

( * ) Notice: Subject to any disclaimer, the term of this patent is extended or adjusted under 35 U.S.C. 154(b) by 0 days.

(21) Appl. No.: 16/780,051

(22) Filed: Feb. 3, 2020

Related U.S. Application Data

(60) Provisional application No. 62/800,515, filed on Feb. 3, 2019.

(51) Int. Cl.
| | |
|---|---|
| *H04W 88/08* | (2009.01) |
| *H01Q 1/52* | (2006.01) |
| *H05K 7/12* | (2006.01) |
| *H05K 7/18* | (2006.01) |
| *H01Q 1/24* | (2006.01) |

(52) U.S. Cl.
CPC .............. *H01Q 1/52* (2013.01); *H01Q 1/246* (2013.01); *H05K 7/12* (2013.01); *H05K 7/186* (2013.01)

(58) Field of Classification Search
CPC . F16L 3/222; F16L 3/1211; F16L 3/13; F16L 3/1058; F16L 21/078; F16L 3/221; F16L 3/137; H02G 7/053; H04W 88/08
USPC ......... 248/62, 63, 65, 67.7, 68.1, 71, 72, 73, 248/74.1, 74.2, 74.4, 218.4, 219.1, 227.1, 248/229.15, 228.6, 229.25, 230.6, 231.71; 455/561
See application file for complete search history.

(56) References Cited

U.S. PATENT DOCUMENTS

| | | | |
|---|---|---|---|
| 4,784,552 A | 11/1988 | Rebentisch et al. | |
| 5,794,897 A | 8/1998 | Jobin et al. | |
| 2014/0179244 A1* | 6/2014 | Colapietro | H01Q 1/1228 455/90.2 |
| 2016/0064813 A1* | 3/2016 | Emerick | H01Q 21/28 343/841 |
| 2018/0045336 A1* | 2/2018 | Vaccaro | H02G 3/32 |

* cited by examiner

*Primary Examiner* — Philip Sobutka
(74) *Attorney, Agent, or Firm* — Mehrman Law Office; Michael J. Mehrman

(57) ABSTRACT

A low-PIM cable support rail assembly includes a metal strut extending in a longitudinal direction positioned within a potential PIM reactive zone of a cellular base station antenna. A channel runner assembly slidably engaged with the strut includes a low-PIM a low-PIM spacer and a low-PIM channel runner block that includes a captured rod anchor, such as a nut or bolt head, engaged with a threaded rod. A compression nut engaged with the threaded rod releasably pinches strut rails between the low-PIM channel runner block and the low-PIM spacer to secure the channel runner assembly at a desired position along the strut. The low-PIM channel runner block and low-PIM spacer prevent metal-to-metal contact when the compression nut is tightened to secure the channel runner assembly to the strut. A cable support block or other component may be spaced apart from the strut along the threaded rod.

20 Claims, 10 Drawing Sheets

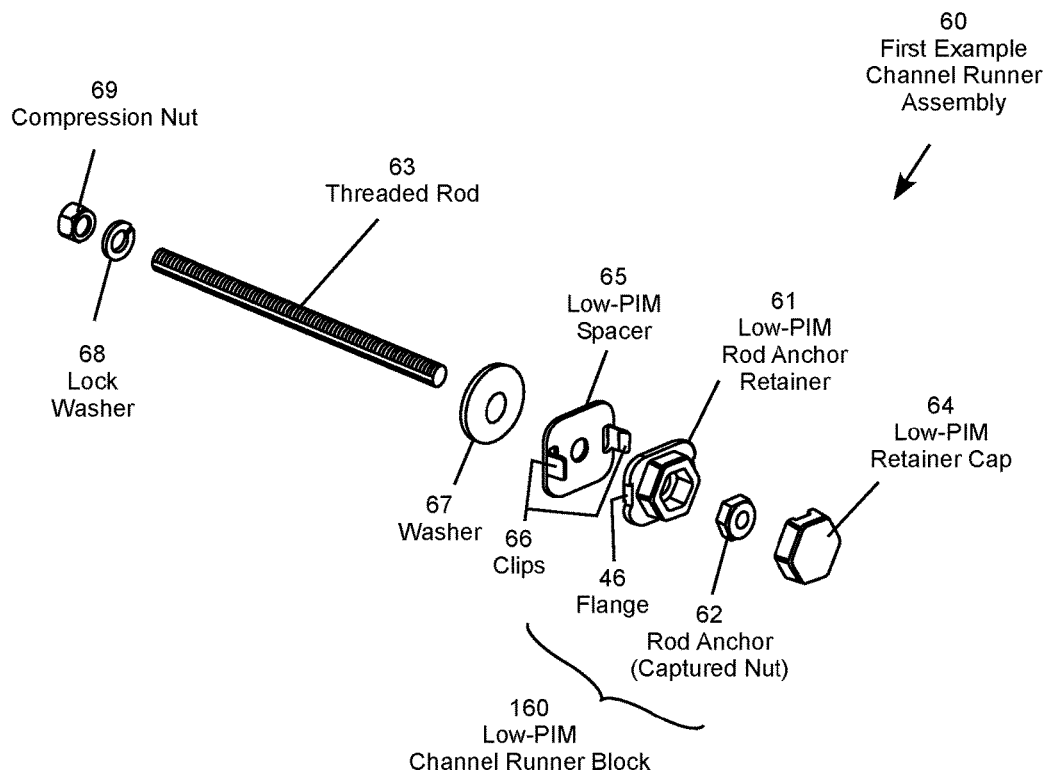
FIG. 6A
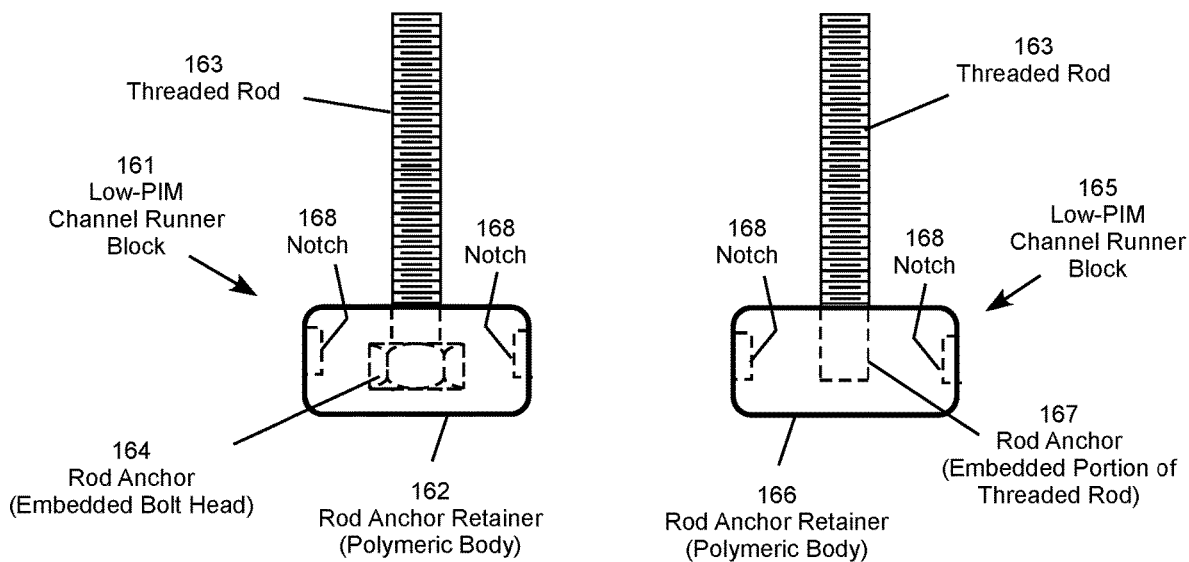
FIG. 6B                    FIG. 6C

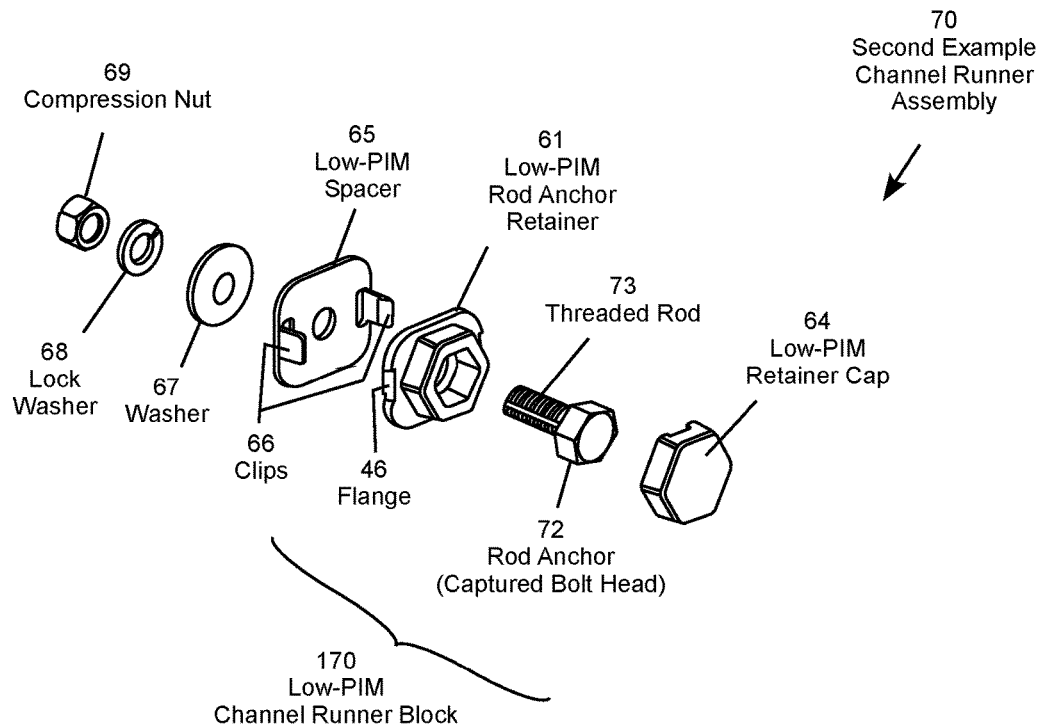
FIG. 7A
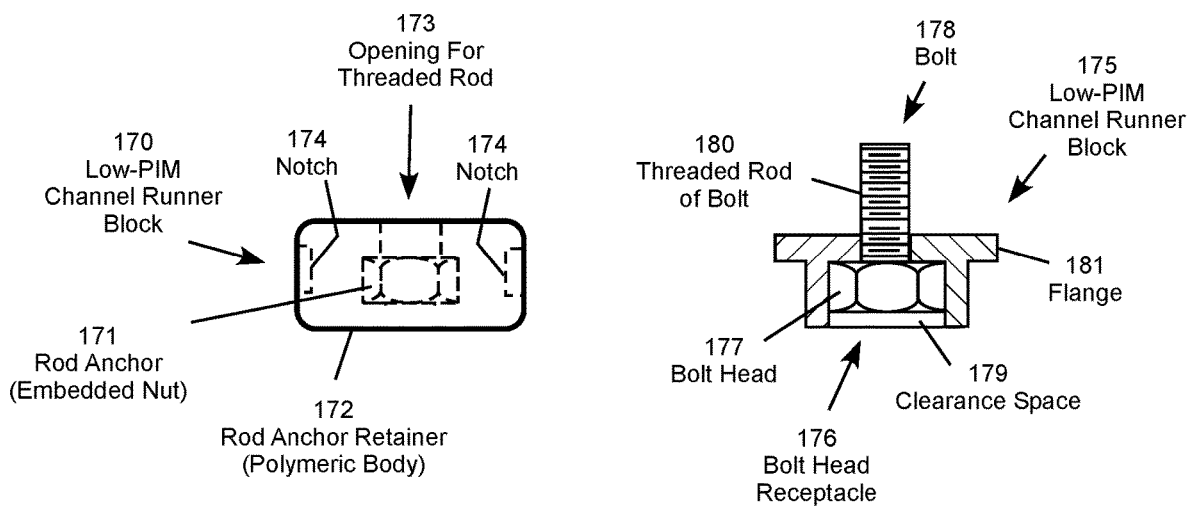
FIG. 7B  FIG. 7C

LOW-PIM CHANNEL RUNNER ASSEMBLY AND CABLE SUPPORT RAIL SYSTEM

REFERENCE TO RELATED APPLICATION

This application claims priority to U.S. Provisional Patent Application Ser. No. 62/800,515 filed Feb. 3, 2019, which is incorporated by reference.

TECHNICAL FIELD

The present invention is directed to cellular communication systems and, more particularly, to a low-PIM channel runner assembly and associated cable support rail system used to reduce passive intermodulation interference (PIM) at cellular telephone base station antenna sites.

BACKGROUND

An essential element of modern mobile communications systems is the "cell site." The cell site includes one or more cellular base station antennas aimed at a desired geographical area of coverage with coaxial cables connecting the antennas to base station radio equipment. The performance of a cell site is often limited by passive intermodulation ("PIM") interference. PIM interference occurs when the high-power downlink signals (the "main beam") transmitted by the base station antenna mixes at passive, non-linear junctions in the RF path, creating new signals. When these new signals (intermodulation products) fall in an antenna's uplink band, they act as interference and reduce the signal-to-interference-plus-noise ratio ("SINR"). As the SINR reduces, the geographic coverage of the cell site reduces and the data capacity of that cell site reduces.

It is well documented that loosely touching metal-to-metal surfaces can behave in a non-linear fashion and become sources of passive intermodulation when illuminated by high power RF signals. Recently, it has been determined that loose metal-to-metal connections located behind base station antennas are also able to generate high levels of passive intermodulation. Even though this region is well outside the main beam of the antenna, enough RF energy is present in this region to excite non-linear objects and generate PIM. Metal brackets and associated hardware for supporting RF, optical, ground and remote electrical tilt ("RET") cable are common sources of loose metal-to-metal contact found in the region behind and close to base station antennas.

A common method for mechanically supporting base station cables utilizes two plastic clamp blocks that fit around one or more cables. An example of this style cable support block is disclosed in Jobin et al, U.S. Pat. No. 5,794,897. In this type of conventional cable support, a ⅜-inch or 10-millimeter diameter stainless steel threaded rod is inserted through the support block halves and stainless-steel hardware is installed to clamp the plastic block halves together on the threaded rod.

In another conventional configuration, a steel strut is used to secure multiple threaded rods for supporting plastic cable support blocks and other components. One end of the threaded rod engages with (screws into) a spring-loaded strut retainer captured inside the strut. An example of this style of spring-loaded strut nut is shown in FIG. 4 of Rebentisch, U.S. Pat. No. 4,784,552, which is reproduced in FIG. 1 (prior art) of this disclosure with the shading and the original element numerals removed, and the new element numerals referenced in the following discussion added.

Referring to FIG. 1, the spring-loaded strut nut 10 can be removably tightened to different places along the elongated steel strut 11, which extends in a longitudinal direction (into the page) transverse to the cross-section shown. A threaded rod 12 passes through a hole in a lock plate 13, which is positioned across a passage 14 between two strut rails 15a-15b that leads into a channel 16 of the strut 11. The threaded rod 12 engages with (screws into) a central hole in a captured nut 17 located in the channel 16. The width of the captured nut 17 is slightly less than the width of the channel 16, which allows the captured nut to slide along the strut in the longitudinal direction while the strut prevents the captured nut from rotating within the channel. A bolt head or compression nut 18 engaged with the threaded rod 12 can be tightened to secure the strut rails 15a-15b between the lock plate 13 and the captured nut 17 to lock the strut nut 10 in place at a desired position along the strut. While the threaded rod 12 shown in FIG. 1 terminates in a bolt head in this particular example, the threaded rod may alternatively pass through a compression nut and extend further away from the strut, which allows a cable support block or another component to be attached to the threaded rod 12.

The strut nut 10 also includes a spring 19 attached to the bottom of the captured nut 17 and located in the channel 16 between the captured nut and the bottom side of the strut, which biases the captured nut 17 toward the strut rails 15a-15b. The spring 19 helps to stabilize the captured nut 17 while it slides along the strut 11 and receives the threaded rod 12 used to tightened the strut nut 10 at a desired position along the strut. This mounting system allows the strut nut 10 to easily slide along the longitudinal axis of the strut 11 into a desired location before being secured in place by tightening the bolt head or compression nut 18 on the threaded rod 12 to lock the strut nut in place. A number of these strut nuts 10 may be positioned in this manner at multiple location along the longitudinal axis of the strut 11 to position multiple cable support blocks and other components in desired positions along the strut.

For example, as shown in FIG. 2 (prior art), a compression nut 20 may be engaged onto the threaded rod 12 and tightened against the lock plate 13 of the strut nut 10 to secure the strut nut in a desired position along the strut 11 with the threaded rod extending beyond the compression nut further away from the strut. This allows an additional component to be attached to the portion of the threaded rod 12 that extends beyond the compression nut 20. In the particular example shown in FIG. 2, the threaded rod 12 extends through a cable support block 21, which supports several coaxial cables 22 at a desired support location. In this example, an end nut 22 is engaged onto the threaded rod 12 and tightened to secure the cable support block 21 between the compression nut 20 and an end nut 22. In a conventional configuration shown in FIG. 3 (prior art), the strut 11 is secured to an antenna mounting pipe 30 using a pair of saddle brackets 31, 32. The strut 11 can be attached to other types of support structures, such as walls, floors, towers, cabinets, angle supports, and so forth.

Multiple sources of passive intermodulation are present with the conventional cable support system described above. First, the strut 11, the threaded rod 12, and the lock plate 13 are typically made of steel with a galvanized or electroplated zinc finish, while the compression nut 20 and the end nut 22 are typically produced from stainless steel. Stainless steel and galvanized steel are at opposite ends of the galvanic series. Over time, corrosion will occur at the dissimilar metal interface creating a source of PIM.

Second, the saddle brackets 31, 32 used to secure the strut 11 to the antenna mounting pipe 30 typically has large surface areas of metal-to-metal contact between the strut and the saddle bracket. It is difficult to maintain a high clamping force over the full contact area between the strut 11 and the saddle brackets 31, 32 resulting in inconsistent metal-to-metal contact, which can also generate PIM.

Third, the strut 11 is typically a steel component purchased in 8-foot or 10-foot standard lengths coated with a galvanized finish for corrosion protection. The standard lengths are often cut in the field to the desired lengths, which exposes the cut surfaces to the weather without corrosion protection. This allows rust to form on the cut faces, which can become another source of PIM.

An improved cable support system is therefore needed to overcome these drawbacks experienced by conventional cable support systems.

SUMMARY

The needs described above are met by an improved low-PIM cable support rail assembly used to secure multiple cables in the potential PIM reactive zone behind a cellular base station antenna. The low-PIM cable support rail assembly maintains the adjustability of existing steel strut systems while eliminating the known sources of passive intermodulation. In an illustrative embodiment, a low-PIM cable support rail assembly includes a metal strut extending in a longitudinal direction positioned within a potential PIM reactive zone of a cellular base station antenna. A channel runner assembly slidably engaged with the strut includes a low-PIM channel runner block, a low-PIM spacer, and mounting hardware for removably securing the channel runner assembly to the strut. The channel runner block includes a captured rod anchor, such as a nut or bolt head, engaged with a threaded rod extending in a transverse direction from the channel runner block. A compression nut engaged with the threaded rod releasably pinches strut rails between the low-PIM channel runner block and the low-PIM spacer to secure the channel runner assembly at a desired position along the strut. The low-PIM channel runner block and low-PIM spacer prevent metal-to-metal contact when the compression nut is tightened to secure the channel runner assembly at the desired position along the strut. A cable support block or other component may be spaced apart from the strut along the threaded rod.

The low-PIM channel runner block may include a polymeric rod anchor retainer carrying a captured rod anchor (e.g., nut or bolt head) engaged with the threaded rod. A polymeric retainer cap may be attached to the polymeric rod anchor retainer preventing the captured rod anchor from falling out of the polymeric rod anchor retainer. Alternatively, the rod anchor may be embedded in a rod anchor retainer (polymeric body) of the channel runner block. A polymeric spacer may be positioned between the strut and the compression nut. The low-PIM cable support rail assembly may include one or more additional channel runner assemblies slidably engaged with the strut, with at least one of the additional channel runner assemblies attached to a mounting structure. The low-PIM cable support rail assembly may also include one or more additional struts, with each additional strut carrying one or more additional channel runner assemblies.

It will be understood that specific embodiments may include a variety of features in different combinations, as desired by different users. The specific techniques and systems for implementing particular embodiments of the invention and accomplishing the associated advantages will become apparent from the following detailed description of the embodiments and the appended drawings and claims.

BRIEF DESCRIPTION OF THE FIGS.

The numerous advantages of the embodiments of the invention may be better understood with reference to the accompanying figures.

FIG. 6A is an exploded perspective view of a first low-PIM channel runner assembly.

FIG. 6B is side view of a channel runner block with an embedded bolt head.

FIG. 6C is side view of a channel runner block with an embedded portion of a threaded rod.

FIG. 7A is an exploded perspective view of a second low-PIM channel runner assembly.

FIG. 7B is side view of a channel runner block with a permanently embedded nut.

FIG. 7C is side cut-away view of a channel runner block with a bolt head receptacle.

DETAILED DESCRIPTION

Figure 1:
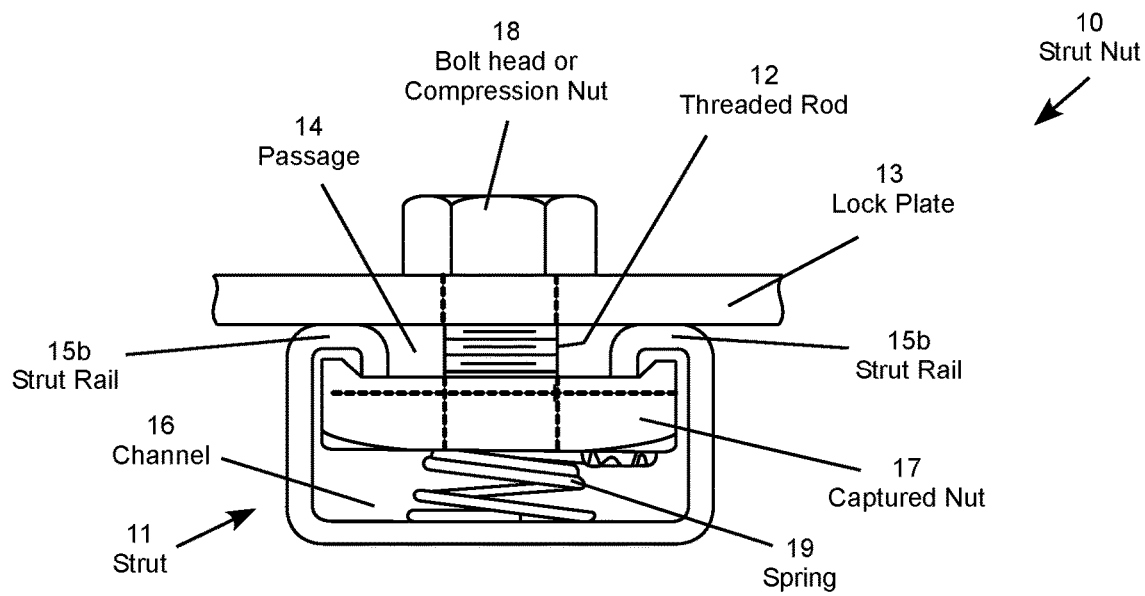
FIG. 1 (prior art) is cross-sectional side view of a conventional strut nut.
Figure 2:
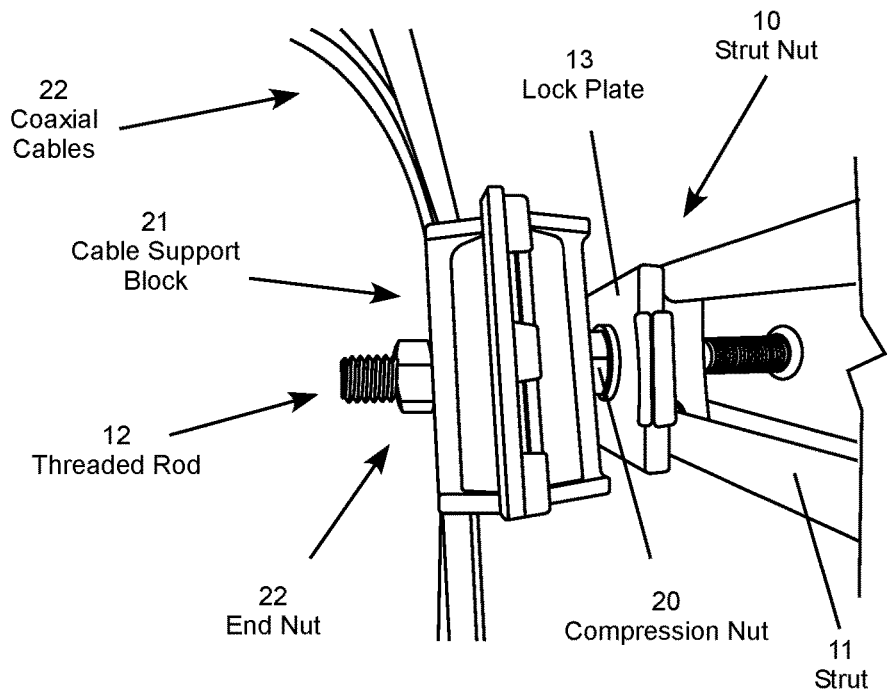
FIG. 2 (prior art) is side view of a conventional strut nut connected to a cable support block supporting several coaxial cables.
Figure 3:
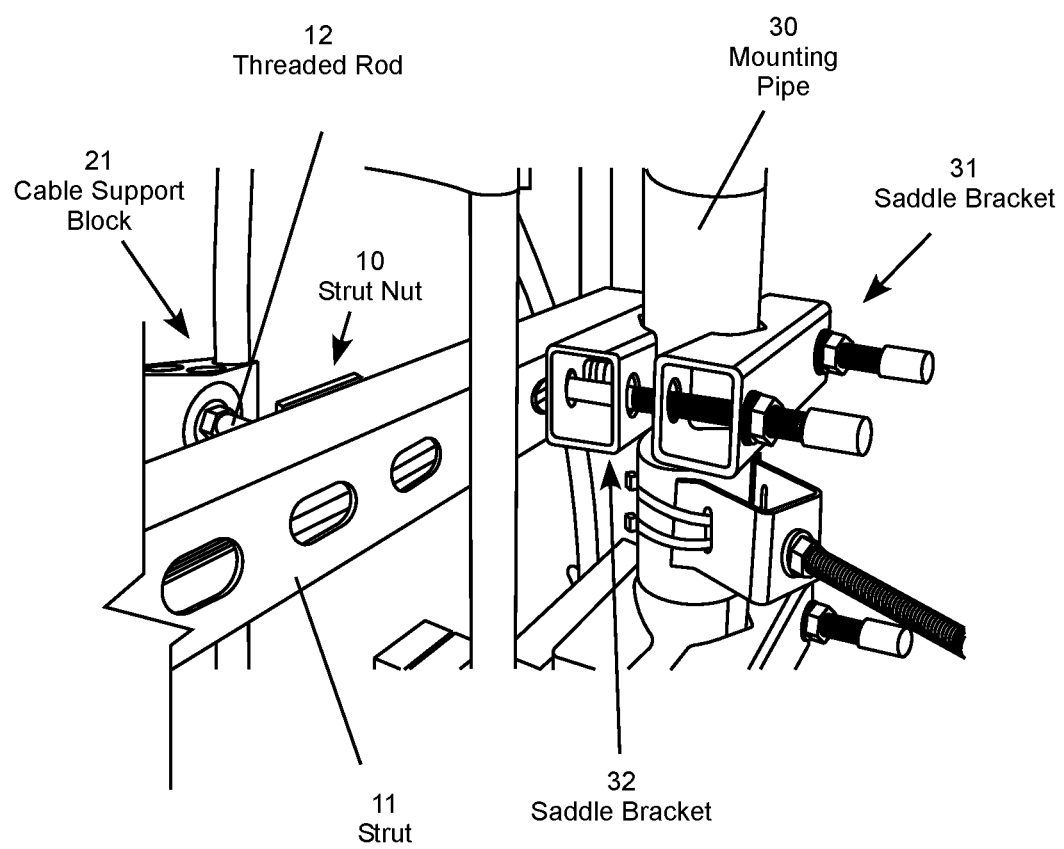
FIG. 3 (prior art) is perspective view of a conventional strut and associated strut nut connected to a mounting pipe by a pair of conventional saddle brackets.

Embodiments of the invention may be embodied in a low-PIM channel runner assembly and associated strut that form the backbone components of a versatile range of low-PIM cable support rail systems used to secure multiple cables and other components at base station antenna cell sites. The innovative cable support rail system improves upon the adjustability of conventional steel strut systems while eliminating the known sources of PIM interference in the potential PIM reactive zones near cellular base station antennas. Embodiments of the invention may be utilized in concert with other techniques to reduce PIM at cellular base stations, such as the low-PIM cable bracket described in commonly owned U.S. Patent Pub. No. 20190390797, and the low-PIM stackable cable hanger described in commonly owned U.S. patent application Ser. No. 16/581,597, which are incorporated by reference.

While the low-PIM channel runner assembly can be utilized in any desired location, it is effective for mitigating PIM interference when deployed in the potential PIM reactive zone near a base station antenna. Although PIM generation is a function of the antenna broadcast frequency and power, equipment specifications may use a standard distance, such as 10-feet from the antenna, to establish the potential PIM reactive zone where PIM mitigation is considered to be appropriate. In other cases, the potential PIM reactive zone may be defined relative to the wavelength of the antenna's operational frequency, such as within one or two wavelengths of the downlink (main beam) frequency channel of the antenna.

The coaxial cables extending from the base station antenna and associated equipment are typically routed and secured to mounting structures in the potential PIM reactive zone. Even though the cables are typically routed behind the main beam of the antenna, enough RF energy can be present in this region to excite non-linear objects and generate PIM interference. For this reason, all directions from the base station within a standard distance, such as 10-feet from the antenna, may be considered to be within the potential PIM reactive zone. In conventional cell sites, metal brackets and associated hardware for supporting RF, optical, ground and remote electrical tilt ("RET") cables located in the potential PIM reactive zone behind base station antennas are common locations of loose metal-to-metal contact that can generate significant levels of PIM.

Generally described, a representative embodiment of the low-PIM cable support rail system includes an extruded aluminum strut having two rectangular channels stacked together, each with a pair of rails defining a longitudinal passage between the strut rails. The channels share a divider wall with their respective passages on opposite sides of the strut spaced apart from the divider wall. Each channel is sized to receive a channel runner assembly that slides along the channel with a threaded rod extending through the passage of its respective channel. Each passage is wide enough to pass the threaded rod with clearance to prevent metal-to-metal contact between the threaded rod and the strut rails. The position of the strut is adjustable by attaching the threaded rods extending from one or more channel runner assemblies carried in a first channel of the strut to a mounting structure and sliding the strut relative to those channel runner assemblies. Once the strut is positioned in the desired location relative to the mounting structure, the strut is locked in place by tightening the mounting hardware of the channel runner assemblies carried in the first channel to secure the strut to the mounting structure.

Likewise, one or more channel runner assemblies carried in the second channel of the strut can be used to attach cable support blocks and other components at desired positions along the strut. Once a channel runner assembly carried in the second channel is positioned at the desired location along the strut, the channel runner assembly is locked in place by tightening the mounting hardware of that channel runner assembly to secure it in place on the strut. A cable support block or other component can then be attached to the threaded rod of the channel runner assembly. For example, a bar, bracket, flange or other structure supporting cable hangers, such as those described in U.S. Pat. Pub. No. 20190390797 and U.S. patent application Ser. No. 16/581,597 may be attached to one or more cable runner assemblies. To provide additional examples, brackets supporting radios, amplifiers, diplexers, filters and other base station equipment may also be attached to one or more cable runner assemblies.

Each channel is configured to accept a number of low-PIM channel runner assemblies that can be tightened to the strut at different places along the strut. In a representative embodiment, the channel runner assemblies carried in one channel of the strut are used to attach the strut to a support structure, while the channel runner assemblies carried in the other channel are used to attach cable support blocks and other components to the strut to create a low-PIM cable support rail assembly. In addition, multiple cable support blocks or other components can be attached to the same threaded rod, as desired. The cable support rail assembly can be further extended to include multiple struts, each carrying multiple channel runner assemblies, to create a very versatile cable support rail system.

The strut as well as the threaded rods and rod anchors of the channel runner assemblies are typically metallic. For example, the strut may be an aluminum extrusion while the threaded rod and nuts or bolt heads may be galvanized or stainless steel. Each channel runner assembly includes low-PIM hardware that prevents metal-to-metal contact in the connections between the channel runner assemblies and the strut. In an illustrative embodiment, the low-PIM hardware includes a non-metallic (e.g., polymeric) low-PIM channel runner block configured to slide inside one of the channels of the strut. The dimensions of the channel runner block allow it to slide easily along the length of the strut while preventing rotation of the block in all three axes. This prevents the channel runner block from rotating or translating in any direction other than along the longitudinal axis of the strut. In certain embodiments, the channel runner block includes a rod anchor retainer with a hexagonal receptacle sized to accept and capture a rod anchor that may be permanently engaged (e.g., a bolt head) or removably engaged (e.g., a nut) with the threaded rod of the channel runner assembly. The receptacle is sized to prevent the rotation of the rod anchor captured within the receptacle. In a representative embodiment, one side of the rod anchor retainer includes a round hole into the receptacle large enough to pass the threaded rod and small enough to retain the rod anchor, such as a hexagonal nut or bolt head. The round hole positions the threaded rod passing through the hole with sufficient clearance to prevent it from making contact with the strut rails. On the other side, the rod anchor retainer includes a hexagonal opening into the receptacle sized to receive the captured rod anchor. The captured rod anchor can thus be entered into the rod anchor retainer through the hexagonal opening of the receptacle with the threaded rod engaged with the captured rod anchor extending through the round hole of the receptacle.

In this embodiment, the low-PIM hardware may also include a non-metallic (e.g., polymeric) low-PIM retainer cap. Once the rod anchor has been entered into the receptacle, the low-PIM retainer cap press-fits onto the rod anchor retainer to capture the rod anchor inside the receptacle. The low-PIM rod anchor retainer, the captured rod anchor, and low-PIM retainer cap together form a low-PIM channel runner block that insulates the metal rod anchor in the receptacle from being able to touch the metal walls of the strut. The low-PIM retainer cap also prevents the threaded rod engaged with the captured nut from passing through the nut and making contact with the metal divider wall between the channels of the strut. In this embodiment, the captured nut is removable from the rod anchor retainer. As another option, the retainer cap may be permanently attached to the rod anchor retainer with the rod anchor permanently captured or embedded within the rod anchor retainer.

The low-PIM hardware also includes a non-metallic (e.g., polymeric) low-PIM spacer. On the outside of the channel, adjacent to the strut rails, the low-PIM spacer is secured to the rod anchor retainer with integral clips that pass through the longitudinal passage of the aluminum strut. The low-PIM spacer has a clearance hole in the middle, concentric with the round hole in the rod anchor retainer, large enough to pass the threaded rod to engage the rod anchor captured in the rod anchor retainer. A large metal washer is typically installed over the threaded rod and against the low-PIM spacer. A lock washer is then installed over threaded rod and against the large washer, followed by a compression nut engaged (screwed onto) the threaded metal rod. Torque is then applied to the compression nut to tighten the strut rails between the low-PIM spacer and the low-PIM rod anchor retainer, which locks the channel runner assembly in place on the strut. The threaded rod extending from the channel runner assembly can then be used to support other components, such as a non-metallic (e.g., polymeric) low-PIM cable support block that, in turn, secures RF, fiber optic, power and grounding cables at cell sites. PIM is prevented in this assembly because the low-PIM non-metallic (e.g., polymeric) rod anchor retainer, retainer cap and spacer insulate the metal threaded rod, captured rod anchor, and the large metal washer from the aluminum strut to prevent the possibility of loose metal-to-metal contact.

To provide versatility, the receptacle may receive the head of a bolt that is permanently attached to threaded rod, or a removable nut that engages with (screws onto) a separate threaded rod. When a bolt is used, the bolt head is inserted into the receptacle with the threaded rod of the bolt passing through the clearance holes in the rod anchor retainer and the spacer. Long bolts are typically used to attach cable support blocks to the strut, while short bolts are often used to secure the strut to mounting structures, such as galvanized steel interface brackets, pole mounting brackets or wall mounting brackets. The low-PIM spacer of the channel runner assembly prevents metal-to-metal contact between the mounting structure and the strut. The channel runner assembly may utilize a galvanized steel bolt to prevent galvanic mismatch between the bolt and the mounting structure, such as an interface bracket.

In a particular embodiment, aluminum is chosen for the strut material so that the struts can be cut to length in the field without concern for corrosion at the cut edges. Stainless steel threaded rods are typically used for securing cable support blocks to the struts. When stainless steel threaded rods are used, the captured nut, large washer and attachment hardware should also be stainless steel to prevent a galvanic mismatch. The low-PIM rod anchor retainer, cap and spacer may be produced from injection molded nylon with 30% glass loading. Although galvanized steel, stainless steel or aluminum struts, rods, nuts, washers and lock washers are typically used, some or all of these components may be made from other materials, including polymeric materials, if desired.

Figure 4A:
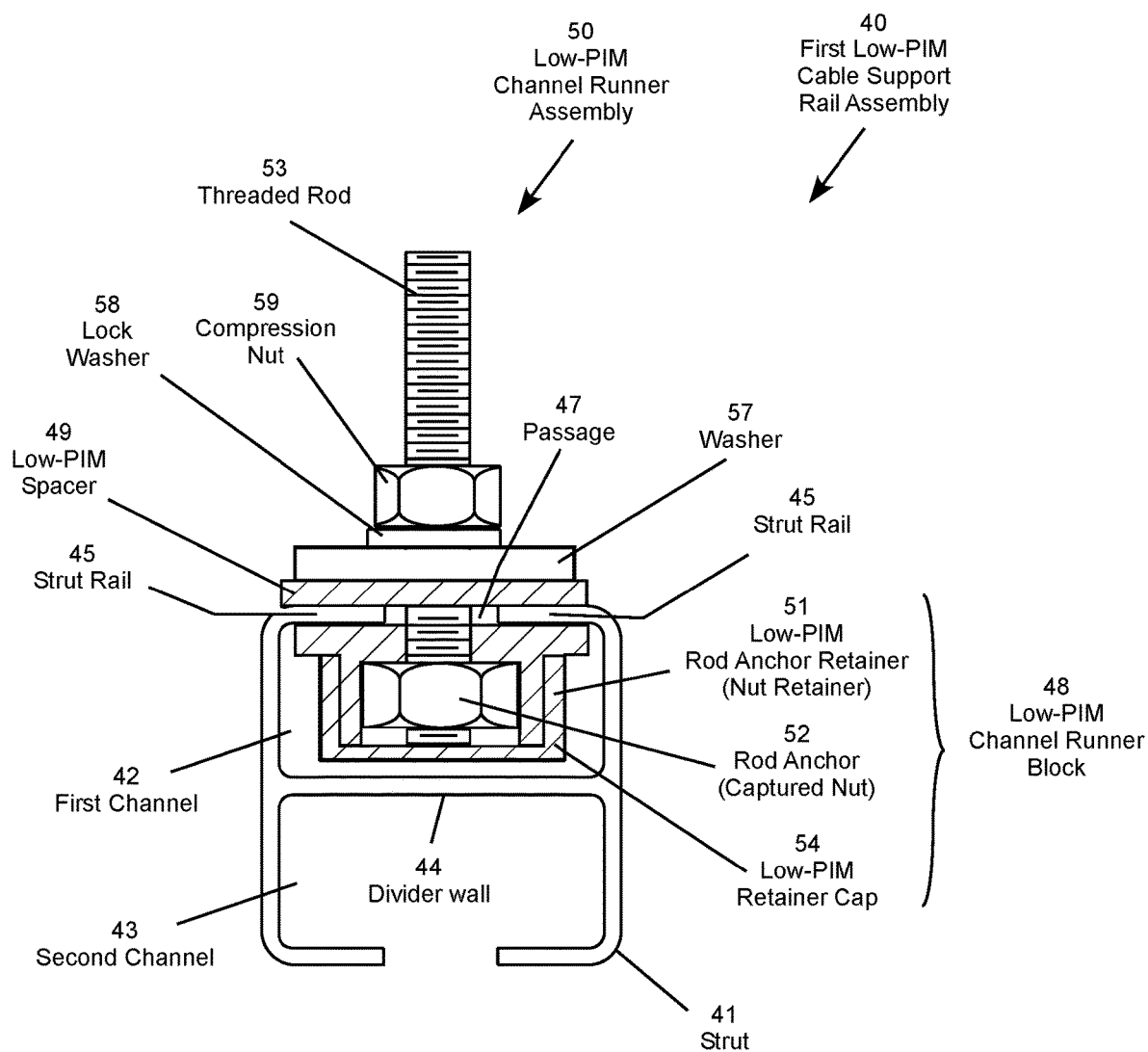
FIG. 4A is a cross-sectional side view of a first low-PIM cable support rail assembly in accordance with the present invention.
Figure 4B:
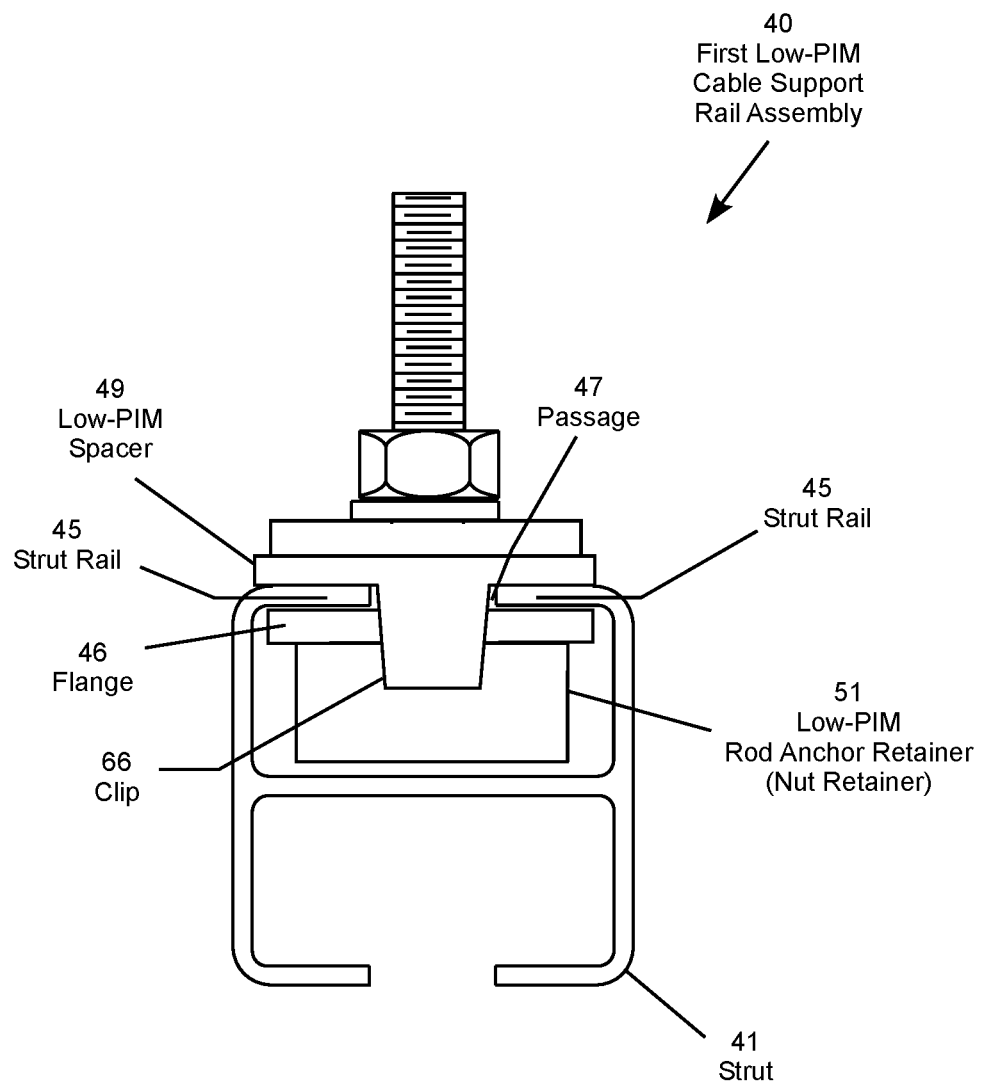
FIG. 4B is a side view of the first low-PIM cable support rail assembly in accordance with the present invention.
Figure 5:
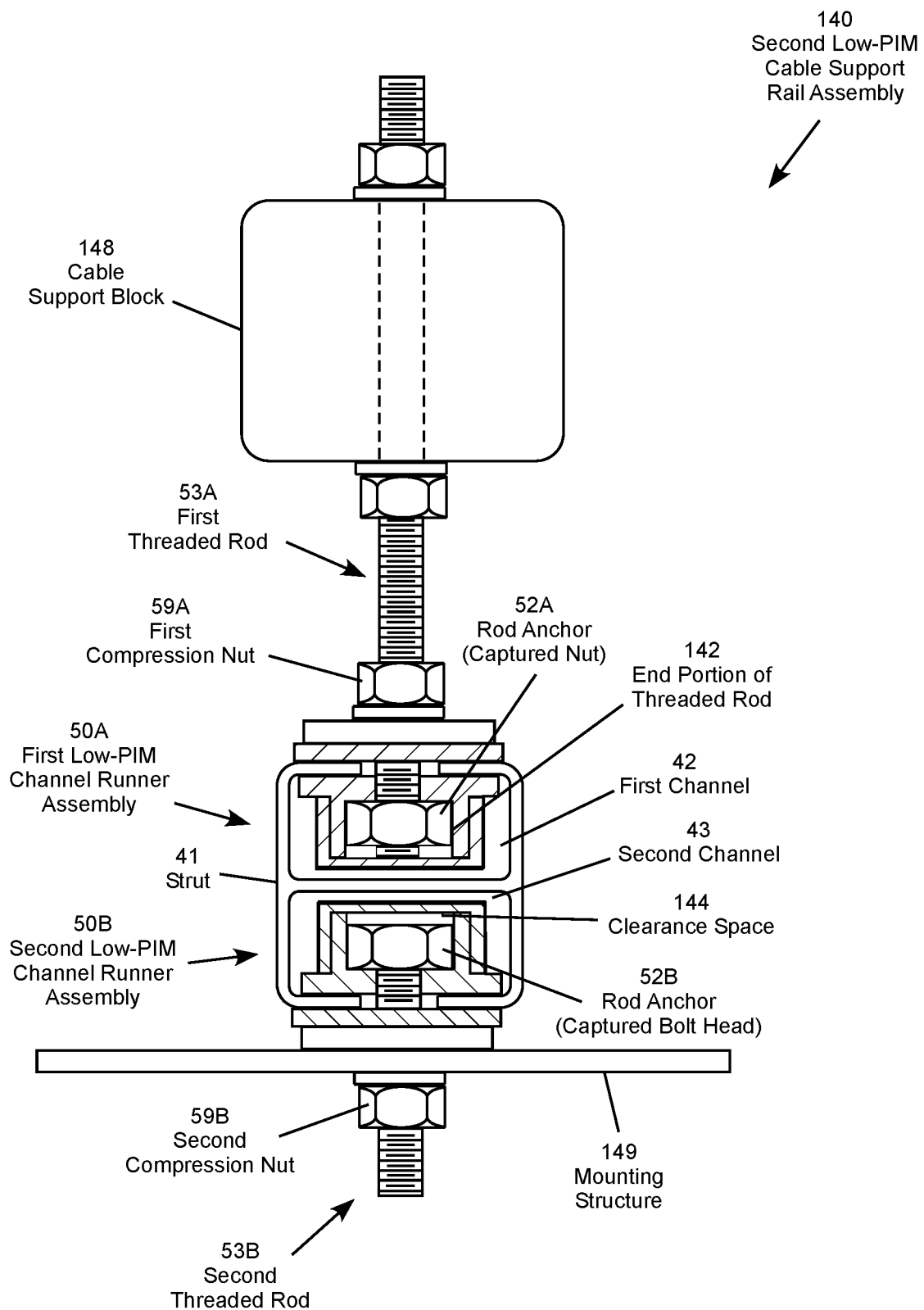
FIG. 5 is a cross-sectional side view of a second low-PIM cable support rail assembly in accordance with the present invention.

Turning now to the drawings, specific representative embodiments are illustrated and described with reference to the figures. FIG. 4A is a cross-sectional side view and FIG. 4B is a side view of a first low-PIM cable support rail assembly 40 that includes a strut 41 carrying a representative channel runner assembly 50. In FIG. 4A, the external profiles of the threaded rod 53 and the rod anchor 52 (captured nut) are shown in solid lines for clarity. The channel runner assembly 50 is configured to slide along the longitudinal axis of the strut 41, which is shown in cross-section. In FIGS. 4A-4B, the longitudinal axis of the strut 41 is transverse (i.e., into the page) to the cross-sectional profile of the strut shown in the figure. In this embodiment, the strut 41 is an aluminum extrusion having first and second rectangular channels 42, 43 stacked together and separated by a divider wall 44. As shown in FIG. 5, which is described in greater detail below, channel runner assemblies carried in the second channel 43 can be used to attach the strut 41 to mounting structures, while channel runner assemblies carried in the first channel 42 can be used to attach cable support blocks and other components to the strut. As the channels are identical, only the first channel 42 carrying the representative channel runner assembly 50 will be described in further detail with reference to FIGS. 4A-4B.

The first channel 42 includes a pair of strut rails 45 that define a passage 47 that extends in the longitudinal direction of the strut. The passage 47 is wide enough to pass a threaded rod 53 into the first channel 42 with clearance to prevent metal-to-metal contact between the threaded rod and the strut rails 45. The divider wall 44 and the bends creating the strut rails 45 provide the strut 41 with considerable strength and rigidity in the longitudinal direction allowing it to firmly resist bending and twisting.

The channel runner assembly 50 includes non-metallic (e.g., polymeric) low-PIM hardware including a low-PIM channel runner block 48 located inside the first channel 42 positioned against one side of the strut rails 45, and a low-PIM spacer 49 located outside the first channel 42 positioned against the other side of the strut rails. The channel runner block 48 is sized to slide inside the first channel 42 allowing to the channel runner assembly 50 to be translated along the longitudinal axis of the strut 41 to a desired position. The mounting hardware of the channel runner assembly 50 can then be tightened to lock the channel runner assembly in place with the strut rails 45 pinched between the low-PIM channel runner block 48 and the low-PIM spacer 49 to prevent metal-to-metal contact between the channel runner assembly and the strut 41.

While several types of channel runner block are shown in various figures, the channel runner block 48 in the particular embodiment shown in FIGS. 4A-4B includes a low-PIM rod anchor retainer 51 (a nut retainer in this embodiment) carrying a rod anchor 52 (a captured nut in this embodiment) engaged with the threaded rod 53 and a low-PIM retainer cap 54. The channel runner block 48 has dimensions allowing it to slide easily along the first channel 42 while preventing rotation of the block in all three axes. This prevents the low-PIM rod anchor retainer 51 from rotating or translating in any direction other than along the longitudinal axis of the strut while preventing the threaded rod 53 from contacting the strut rails 45. In this embodiment, the low-PIM rod anchor retainer 51 includes a hexagonal receptacle sized to accept the rod anchor 52, which in this case is a hexagonal stainless steel nut. The receptacle is sized to prevent the rotation of the rod anchor 52 within the receptacle. On one side, the low-PIM rod anchor retainer 51 includes a round hole into the receptacle large enough to pass the threaded rod 53 and small enough to retain the rod anchor 52 in the receptacle. The round hole positions the threaded rod 53 passing through the hole with sufficient clearance to prevent it from making contact with the strut rails 45. On the other side, the low-PIM rod anchor retainer 51 includes an opening into the receptacle sized to pass the rod anchor 52, which in this example is a hexagonal threaded nut. The hexagonal rod anchor can thus be entered into the low-PIM rod anchor retainer 51 through the hexagonal opening with the threaded rod 53 extending through the round hole.

The low-PIM channel runner block 48 also includes a low-PIM non-metallic (e.g., polymeric) retainer cap 54. Once the rod anchor 52 has been entered into the low-PIM rod anchor retainer 51, the retainer cap 54 press-fits onto the rod anchor retainer to capture the rod anchor 52 in the rod anchor retainer. The low-PIM rod anchor retainer 51, the captured rod anchor 52, and the low-PIM retainer cap 54 together form the low-PIM channel runner block 48, which together with the low-PIM spacer 49 insulates the metal rod anchor 52 and the threaded rod 53 from being able to touch the metal walls of the first channel 42. When the rod anchor 52 is a captured nut the low-PIM retainer cap 54 also prevents the threaded rod 53 from passing through the nut and making contact with the metal divider wall 44 between the channels of the strut. In the embodiment shown in FIGS. 4A-4B, the rod anchor 52 is a hex nut that can be removed from the channel runner block 48 when the retainer cap is removed from the rod anchor retainer. As another option, for example when the rod anchor is a bolt head, the channel runner block may include a rod anchor retainer without a retainer cap provided that there is sufficient clearance between the divider wall of the strut and the bolt head to prevent metal-to-metal contact when the channel runner assembly is tightened down at a desired position along the strut. The rod anchor 52 may also have a shape different from hexagonal, such as square, triangular, and so forth. In other embodiments illustrated in various figures, the rod anchor may be permanently embedded in the channel runner block.

As noted above, the low-PIM hardware also includes a low-PIM spacer 49 positioned on the outside of the first channel 42 adjacent to the strut rails 45. As shown in FIG. 4B, the spacer 49 is secured or removably secured to the low-PIM rod anchor retainer 51 by a pair of integral clips 66 (see also FIGS. 6A and 7A) slightly narrower than the passage 47 that pass through the passage between the strut rails 45 and engage with a flange 46 (see also FIGS. 6A and 7A) of the rod anchor retainer 51. However, a low-PIM spacer without clips may be utilized, such as a large polymeric washer. The spacer 49 has a clearance hole in the middle, concentric with the round hole in the low-PIM rod anchor retainer 51, which is large enough to pass the threaded rod 53. A large metal washer 57 is typically installed over threaded rod 53 and against the low-PIM spacer 49. A lock washer 58 is then installed over threaded rod 53 and against the large metal washer 57, followed by a compression nut 59 engaged with (screwed onto) the threaded rod. Torque is then applied to the compression nut 59 to secure the strut rails 45 between the low-PIM spacer 49 and the low-PIM rod anchor retainer 51, which locks the channel runner assembly 50 in place on the strut 41. The threaded rod 53 extending from the channel runner block can then be connected to a mounting structure or another component. For example, the threaded rod 53 can be used to support a non-metallic (e.g., polymeric) low-PIM cable support block that, in turn, secures RF, fiber optic, power or grounding cables at cell sites. PIM is prevented in this assembly because the low-PIM hardware including the low-PIM rod anchor retainer 51, retainer cap 54 and spacer 49 insulate the metal threaded rod 53, the rod anchor 52, and the large metal washer 57 from the aluminum strut 41 to prevent the possibility of loose metal-to-metal contact. When the rod anchor 52 is removable from the channel runner block 48, the retainer cap 54 prevents the rod ancho from falling out of the low-PIM rod anchor retainer 51 or rotating with respect to the rod anchor retainer, which facilitates tightening the compression nut 59 to secure the channel runner assembly 50 in a desired position along the strut 41. In addition, when the rod anchor 52 is a captured nut, the retainer cap 54 also prevents the metal threaded rod 53 from contacting the divider wall 44 of the strut 41.

The channel runner assembly 50 can be easily snapped together in the field, inserted into the end of the first channel 42, slid to a desired position along the strut 41, and easily tightened in place. In addition, the strut 41 in this embodiment is an aluminum extrusion that is easily cut to a desired length in the field without creating exposed cut surface that can rust in the weather. The channel runner assembly 50 and associated strut 41 thus form the backbone components of a wide range of cable support rail configurations.

FIG. 5 is a cross-sectional side view of a second low-PIM cable support rail assembly 140, which expands upon the first low-PIM cable support rail assembly 40 shown in FIGS. 4A-4B. In FIG. 5, the external profiles of the threaded rods 53A-53B and the rod anchors 52A-52B (captured nuts) are shown in solid lines for clarity. The second low-PIM cable support rail assembly 140 includes a strut 41 in which the first channel 42 carries a first low-PIM channel runner assembly 50A, and the second channel 43 that carries a second low-PIM channel runner assembly 50B. A first threaded rod 53A of the first low-PIM channel runner assembly 50A supports a cable support block 148 spaced apart from the strut 41 along the first threaded rod. A second threaded rod 53B of the second low-PIM channel runner assembly 50B is attached to a mounting structure 149. This is a basic low-PIM cable support rail configuration from which a wide range of variations may be adapted, as represented by the examples shown in FIGS. 6-10.

In this particular example, the first channel runner assembly 50A includes a first rod anchor 52A, which in this example is a threaded nut. This allows an end portion 142 of the threaded rod extend past the first rod anchor 52A when the first compression nut 59A is tightened to secure the first threaded rod 53A to the strut 41. As another example, the second channel runner assembly 50B includes a second rod anchor 52B, which in this example is a bolt head. This creates a clearance space 144 behind the second rod anchor 52B when the second compression nut 59B is tightened to secure the second channel runner assembly 50B to the mounting structure 149. This would allow the second channel runner assembly 50B to exclude a retainer cap, if desired.

FIG. 6A is an exploded perspective view of a first example channel runner assembly 60. This example channel runner assembly includes a low-PIM (e.g., polymeric) retainer cap 64, a rod anchor 62 (nut) that is captured within a low-PIM rod anchor retainer 61. In this embodiment, the retainer cap 64, the rod anchor 62 (nut), and the rod anchor retainer 61 form a low-PIM channel runner block 160 that slides within the channel of a strut. In addition, a low-PIM (e.g., polymeric) spacer 65 with integral clips 66 allows the spacer 65 to removably attached to the rod anchor retainer 61. The low-PIM spacer 65 is typically attached to the rod anchor retainer 61 at the factory so that the spacer cannot be inadvertently omitted during assembly in the field. Because pinching the strut rail between the low-PIM rod anchor retainer 61 and the low-PIM spacer 65 achieves the desired low-PIM performance, attaching the spacer to the rod anchor retainer before field assembly helps to avoid incorrect assembly in the field. Once the spacer 65 is attached to the rod anchor retainer 61, the spacer has a range of movement allowing it to separate far enough from the rod anchor retainer to allow the strut rails to pass between the spacer and the rod anchor retainer. The clips 66 attaching the spacer 65 to the rod anchor retainer 61 prevent the channel runner block 160 from coming apart while allowing the channel runner block to easily slide along the strut. When torque is applied to the compression nut 69, the spacer 65 cinches toward the rod anchor retainer 61 to pinch the strut rails between the spacer and the rod anchor retainer.

The threaded rod 63 is typically engaged with (screwed into) the rod anchor 62 (nut) and extends through the passage between the strut rails so that it slides along the strut with the channel runner block 160. The threaded rod 63 extends through a metal washer 67, through the spacer 65, and into the rod anchor retainer 61 where it threadably engages with (screws into) the captured nut 62. The compression nut 69 and lock washer 68 are installed onto the threaded rod 63 and used to tighten the channel runner assembly 60 at a desired position along a strut. The retainer cap 64 may removably press-fit onto the rod anchor retainer 61, which allows the captured nut 62 to be removed from the rod anchor retainer when the channel runner block 160 is outside the strut channel.

FIG. 6B is side view of an alternative channel runner block 161 that includes an a polymeric rod anchor retainer 162 permanently attached to an embedded rod anchor 164, which is permanently attached to a threaded rod 163. In this example, the rod anchor retainer 164 is a polymeric body molded onto the rod anchor 162, which is shown as a hexagonal bolt head. Other types of rod anchors may be used, such as a round disk, triangular or square plate, and so forth. For example, FIG. 6C shows another embodiment, in which the rod anchor retainer 166 is a polymeric body molded onto a rod anchor 167, which is an end portion of the threaded rod 163. The rod anchor retainers 162 and 166 may include notches 168 or a flange for engaging with integral clips 66 of the low-PIM spacer 65, although a polymeric spacer without clips may be utilized as another option.

To provide another example, FIG. 7A is an exploded perspective view of a second example channel runner assembly 70. In this embodiment, the channel runner assembly includes a low-PIM (e.g., polymeric) retainer cap 64 and a threaded rod 73 that is permanently connected to a bolt head 72 that is captured in the low-PIM rod anchor retainer 61. In this embodiment, the retainer cap 64, the rod anchor 72 (bolt head), and the rod anchor retainer 61 form a low-PIM channel runner block 170 that slides within the channel of a strut. The low-PIM spacer 65 with integral clips 66 is typically attached to the low-PIM rod anchor retainer 61 at the factory so that the spacer cannot be omitted during assembly in the field. The threaded rod 73 is engaged with (permanently attached to) the rod anchor (bolt head) 72 and extends through the passage between the strut rails so that it slides along the strut with the channel runner block 170. This example also includes a compression nut 69, washer 67, and lock washer 68 similar to those described with reference to FIG. 6. In this embodiment, the retainer cap 64, rod anchor 72 (bolt head), and the rod anchor retainer 61 form a low-PIM channel runner block 170 that slides within the channel of a strut. In other words, the second example channel runner assembly 70 is similar to the first example channel runner assembly 60, except that the first example channel runner assembly 60 utilizes a threaded rod 63 that removably engages with (screws into) the rod anchor 62 (nut) captured in the rod anchor retainer 61, whereas the second example channel runner assembly 70 a threaded rod 73 permanently attached to a rod anchor 62 (bolt head) captured in the rod anchor retainer 61.

FIG. 7B is side view of an alternative channel runner block 170 that includes a rod anchor (nut) 171 permanently embedded in a rod anchor retainer 172 providing an opening 173 allowing a threaded rod to be engaged with (screwed into) the rod anchor. In this embodiment, the rod anchor retainer 172 may be a polymeric body and the rod anchor 171 may be a hexagonal nut embedded in the polymeric body. The rod anchor retainer 172 includes notches 174 or a flange for engaging with integral clips 66 of the low-PIM spacer 65 shown in FIG. 7A.

FIG. 7C is side cut-away view of alternative channel runner block 175 with a bolt head receptacle 176 sized to receive a bolt head 177 of a bolt 178. The bolt head receptacle 176 is sized to create a clearance space 179 when a compression nut on the bolt 178 is tightened to secure the channel runner block 175 in a desired position on a strut. The clearance space 179 ensures that the bolt cannot come into contact with the strut while the dimensions of the channel runner block 175 and the location of the bolt head receptacle 176 positions the threaded rod 180 of the bolt 178 so that it cannot come into contact with the strut rails. For this embodiment, the clearance space 179 may not be required, provided that there is sufficient clearance between the bolt head 176 and the strut when a compression nut on the bolt 178 is tightened to secure the channel runner block 175 at a desired position along a strut. In this case, the shape of the low-PIM channel runner block 175 and the shape of the strut ensure that there is sufficient clearance between the bolt head 176 and the strut when a compression nut on the bolt 178 is tightened to secure the channel runner block at a desired position on a strut. As in the other embodiments, the shape of the channel runner block 175 prevents it from rotating within the channel of the strut, while portions of the strut rails are compressed between the low-PIM channel runner block 175 and a low-PIM spacer when the compression nut is tightened to secure the low-PIM channel runner block at the desired location along the strut. The clips 66 of the low-PIM spacer 65 shown in FIG. 7A engage with a flange 181 of the rod anchor retainer 176, although a polymeric spacer without clips may be utilized as another option. The various options shown in FIGS. 6A-6C and 7A-7B provide the advantage of versatility in the field, which allows a technician to select among a range of features for the channel runner assemblies based on the needs of particular installations. The versatility of the cable support rail system is further illustrated by the cable support rail assemblies described with reference to FIGS. 8 and 9, below.

Figure 8:
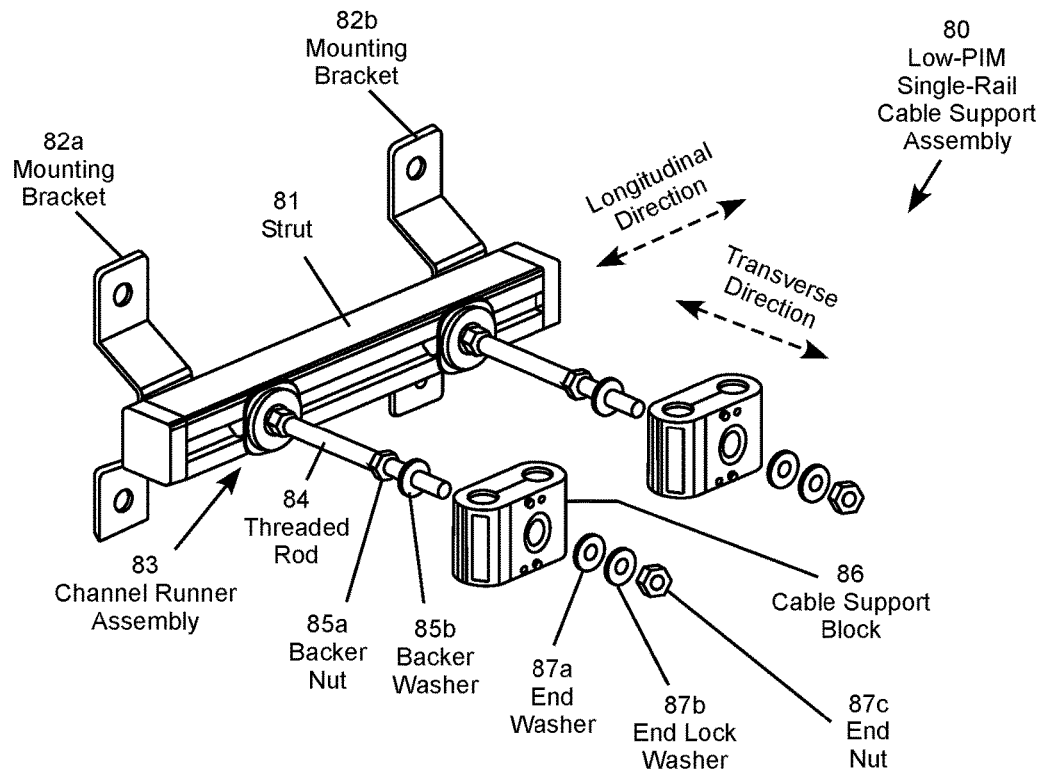
FIG. 8 is a perspective exploded view of a low-PIM single-rail cable support assembly.

FIG. 8 is a perspective assembly view of a low-PIM single-rail cable support assembly 80 illustrating a relatively simple example cable support configuration. This particular embodiment includes a single strut 81 that extends in a longitudinal direction attached to a pair of mounting brackets 82a-82b that can be used to attach the strut to a variety of mounting structures, such as a wall, a portion of a tower, a pair of structural beams, and so forth. A pair of channel runner assemblies attach the strut 81 to the mounting brackets 82a-82b at selectable positions along the strut. The strut 81 carries two additional channel runner assemblies and associated cable support blocks. Only one set of these components is labeled in FIG. 8 to avoid cluttering the figure.

The channel runner assembly 83 is slidably engaged with the strut 81, as described previously with reference to FIGS. 4A-4B, allowing it to be translated along the longitudinal direction of the strut and tightened into place at any desired position along the of the strut. The channel runner assembly 83 includes a threaded rod 84 that extends away from the strut 81 in a direction transverse to the longitudinal direction of the strut. A backer nut 85a and backer washer 85b are positioned at a desired location along the threaded rod 84 allowing the cable support block 86 (or another desired component) to be attached to the threaded rod spaced apart from the strut 81 in the transverse direction. The backer nut is threaded onto the threaded rod 84 allowing it to be rotated on the threaded rod to move it to a desired position along the threaded rod. The cable support block 86 is installed on the threaded rod 84 and pushed into engagement with the backer nut 85*a* and backer washer 85*b*. A end washer 87*a*, end lock washer 87*b*, and end nut 87*c* are then installed on the threaded rod 84 to secure the cable support block 86 in the desired position along the threaded rod. The threaded rod 84 can be extended, as desired, allowing multiple cable blocks to be attached at selected locations spaced along the threaded rod.

Figure 9:
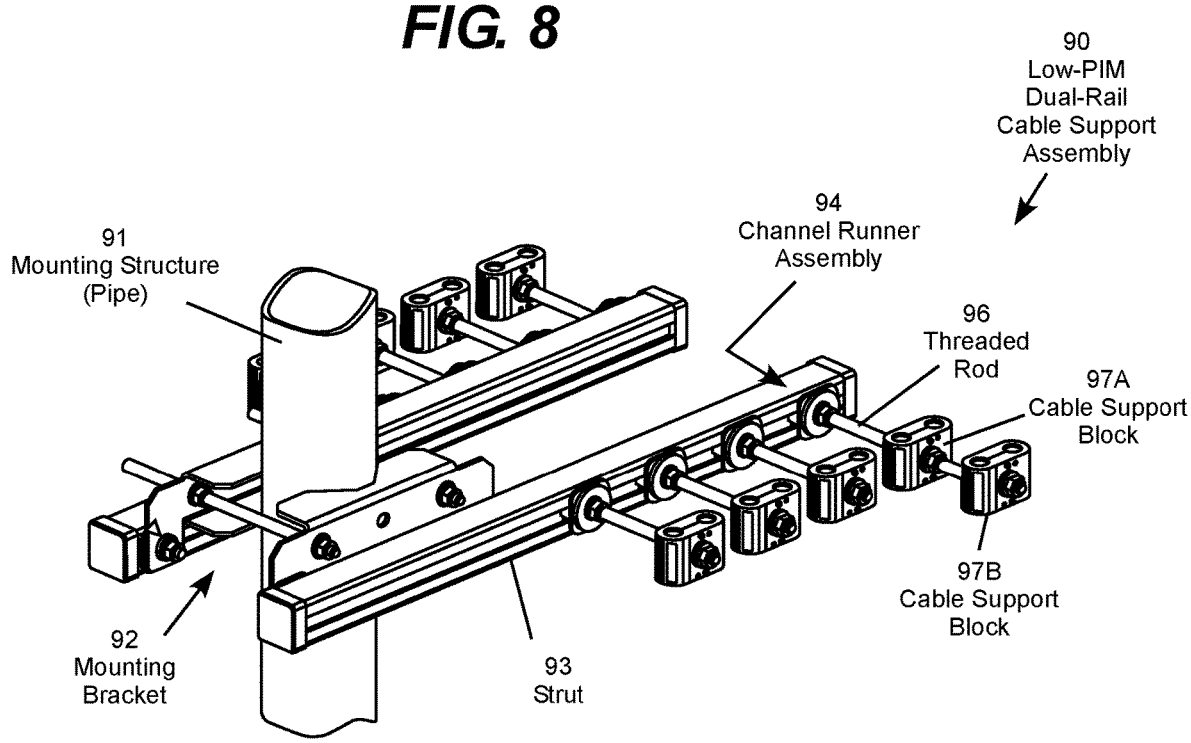
FIG. 9 is a perspective view of a low-PIM dual-rail cable support assembly.

FIG. 9 is a perspective of a low-PIM dual-rail cable support assembly 90. This assembly includes a mounting pipe 91 supporting a mounting bracket 92, which supports two struts that each carry four channel runner assemblies that, in turn, each support a respective cable support block. Only one set of these components is labeled in FIG. 9 to avoid cluttering the figure. The strut 93 extends from the mounting bracket 92 in a longitudinal direction. The channel runner assembly 94 is slidably engaged with the strut 93, as described previously with reference to FIGS. 4A-4B, allowing it to be tightened into place at any desired position along the longitudinal axis of the strut. A threaded rod 96 extends from the channel runner assembly 94 in a direction transverse to the longitudinal axis of the strut 93. A cable support block 97A is attached to threaded rod 96 spaced apart from the channel runner assembly 94 in the transverse direction. The threaded rod 94 can be extended, as desired, allowing multiple cable blocks to be attached at selected locations spaced along the threaded rod. Multiple channel runner assemblies can be similarly secured in desired positions along the strut 93. The strut 93 could extend on both sides of the mounting pipe 91 with channel runner assemblies positioned on both sides of the mounting pipe. To illustrate another aspect of the versatility of the innovative cable support rails system, the threaded rod 96 in this particular example supports two cable support block 97A and 97B spaced apart along the threaded rod. In addition, multiple struts and mounting brackets may be supplied, resulting in a highly versatility cable support rail system.

Figure 10A:
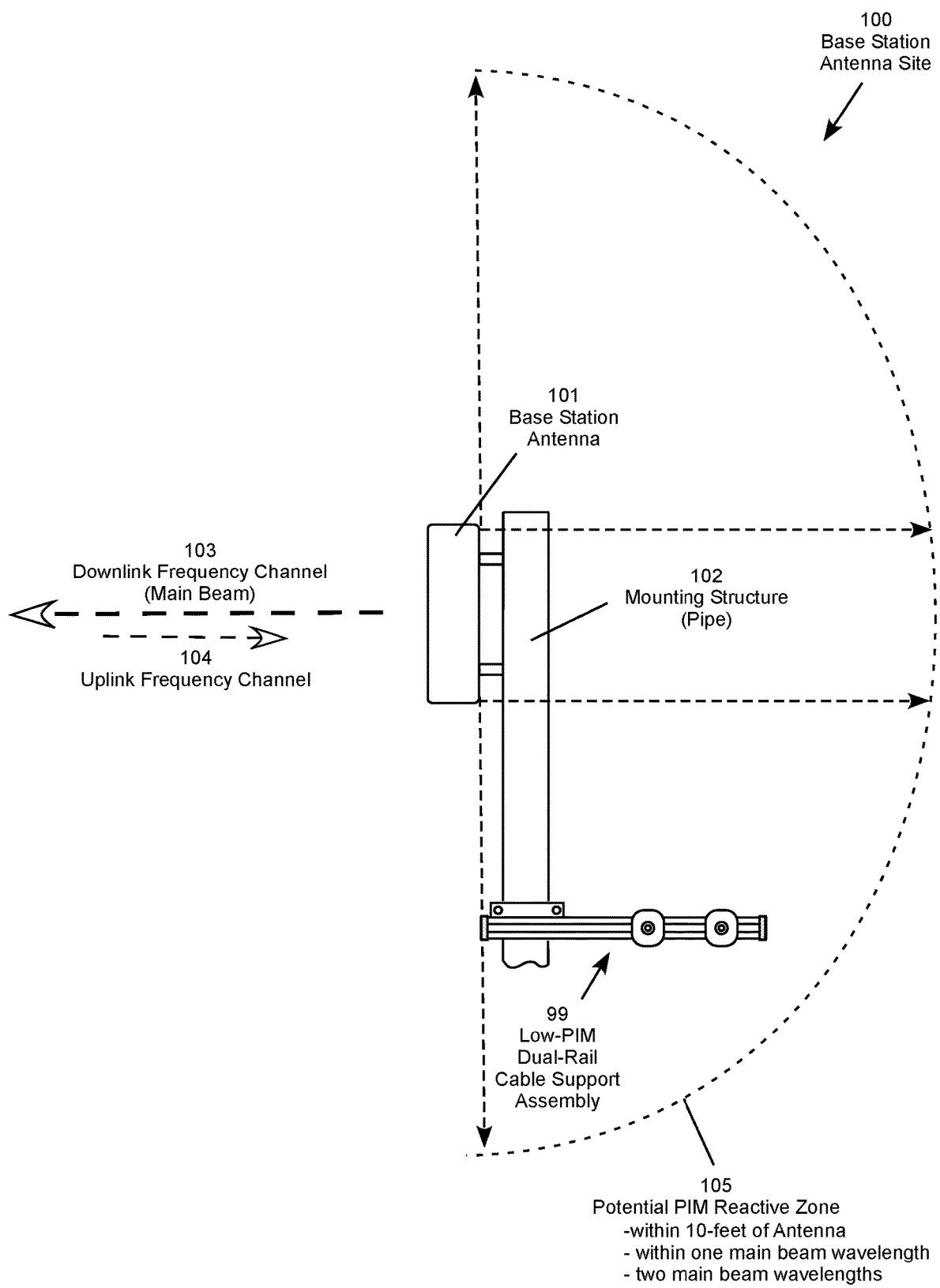
FIG. 10A is a conceptual side view of a low-PIM dual-rail cable support assembly positioned within a potential PIM reactive zone of a base station antenna.
Figure 10B:
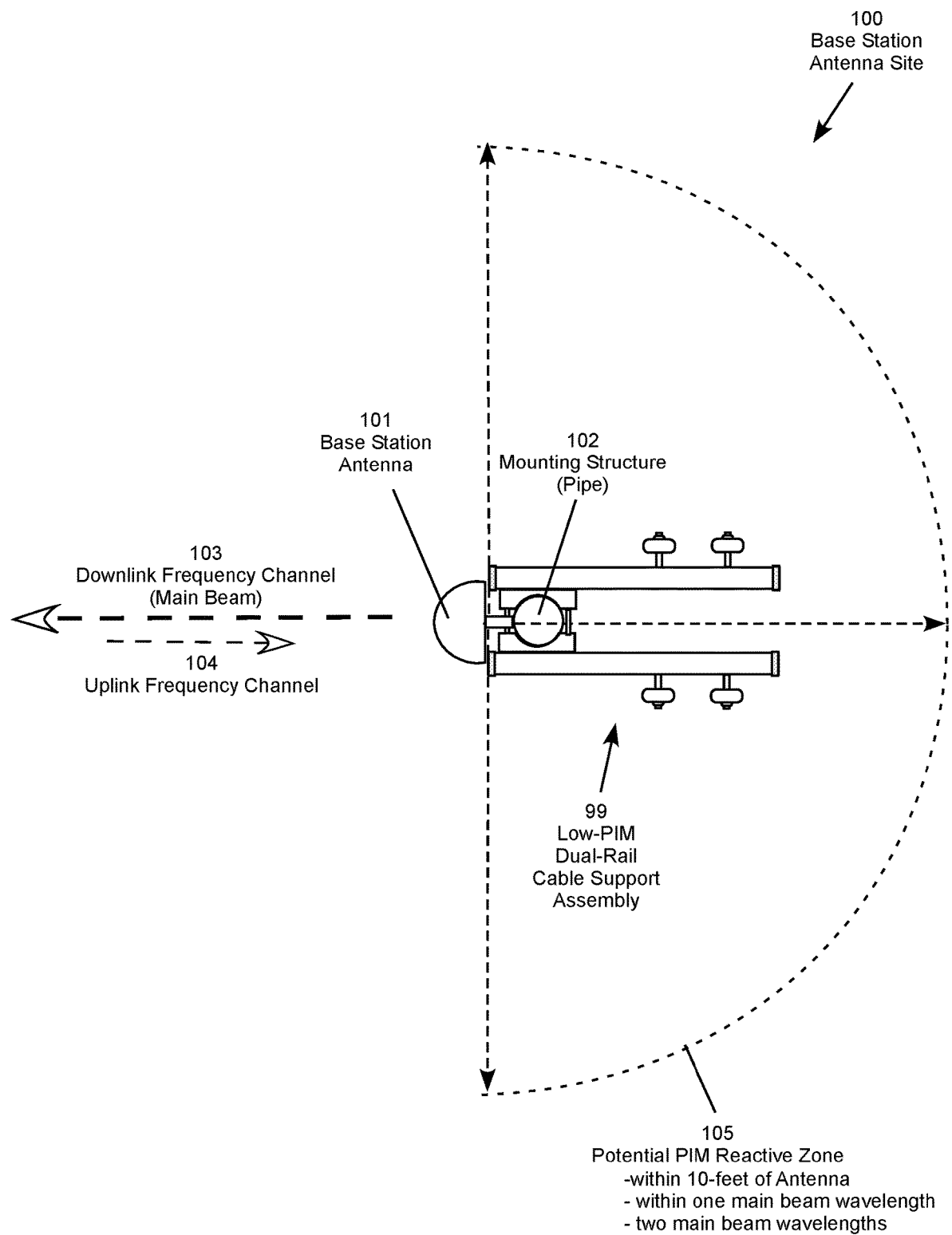
FIG. 10B is a conceptual top view of a low-PIM dual-rail cable support assembly positioned within a potential PIM reactive zone of a base station antenna.

FIG. 10A is a conceptual side view and FIG. 10B is a conceptual top view of a representative base station cell site 100 that includes a base station antenna 101 supported by a mounting structure 102. To briefly recap the problem to be solved, the antenna 101 directionally broadcasts higher-power downlink communication signals away from the antenna (generally referred to as the "main beam" of the antenna) within a downlink frequency channel 103 to registered mobile communication devices within the communication reach of the antenna. The antenna 101 also receives lower-power uplink communication signals from the registered mobile communication devices within a separate uplink frequency channel 104 allowing for duplex communications, such as mobile telephone conversations, between the antenna 101 and the registered mobile communication devices within the communication reach of the antenna. Passive intermodulation ("PIM") interference occurs when the downlink signals within the downlink frequency channel 103 mix at nonlinear reflectors near the antenna 101 to create noise within the uplink frequency channel 104 received by the antenna. The PIM interference decreases the signal-to-interference plus-noise ratio ("SINR") of the uplink within the uplink channel of the antenna 101, which reduces the communication quality and information carrying capacity (bandwidth) of the uplink frequency channel.

It is well documented that loosely touching metal-to-metal surfaces can behave in a non-linear fashion and become sources of PIM interference when illuminated by high power RF signals. For this reasons, the coaxial cables and other components associated with operation of the antenna are located well outside and behind the main beam of the antenna. It has recently been determined, however, that loose metal-to-metal connections located behind a base station antenna can generate high levels of passive intermodulation. Even though this region is well outside the main beam of the antenna, enough RF energy can be present in this region to excite non-linear objects and generate PIM interference. Metal brackets and associated hardware for supporting RF, optical, ground and remote electrical tilt ("RET") cables are common sources of loose metal-to-metal contact found in this region behind and close to the base station antenna. Embodiments of the present invention include a range of low-PIM cable support rail assemblies designed to mitigate the generate PIM interference by the equipment used to support the cables and other components associated with the operation of the antenna, which are typically located near the antenna outside the main beam of the antenna.

To develop standards for mitigating PIM, technicians may define a potential PIM reactive zone 105 in which PIM mitigation equipment should be installed. FIGS. 10A-10B illustrate this practice for a representative example base station antenna site 100, in which a low-PIM dual-rail cable support assembly 99 is attached to a mounting pipe 102 within a potential PIM reactive zone 105 defined for an antenna 101. In this example, the representative low-PIM dual-rail cable support assembly 99 is located well outside the main beam 103 and physically behind the antenna 101 on the opposite side of the mounting pipe 102 from the antenna. The low-PIM dual-rail cable support assembly 99 is nevertheless specified to provide PIM mitigation because it is still located with the potential PIM reactive zone 105 defined for the antenna 101. The dual-rail cable support assembly 99 is representative of the low-PIM cable support rail assemblies generally, as all of the low-PIM cable support rail assemblies described in the disclosure, and variations of these specific examples, are intended for deployment as PIM mitigation measures in the potential PIM reactive zones of cellular base station antennas.

While the low-PIM channel runner assemblies and associated cable support rails embodiments of the present invention can be utilized in any desired location, they are particularly effective for mitigating PIM interference when deployed in the potential PIM reactive zone 105 near the base station antenna 101. Although PIM generation is a function of the antenna broadcast frequency and power, technicians may use a standard distance, such as 10-feet from the antenna 101, to establish the potential PIM reactive zone 105 where PIM mitigation is appropriate. As other options, the potential PIM reactive zone 105 may be established to be a function of the antenna broadcast frequency, such as one or two wavelengths of the main beam frequency channel 103 of the antenna 101. Other factors, such as the broadcast power of the antenna 101, the presence of reflective surfaces in the physical environment of the antenna, the width of the uplink channel, the use of electronic filtering, and other relevant factors may also be taken into account when establishing the potential PIM reactive zone for a particular antenna. For administrative simplicity, however, the standard set for potential PIM reactive zone 105 may ultimately be defined to be a set distance, such as 10-feet from the antenna.

While particular aspects of the present subject matter have been shown and described in detail, it will be apparent to those skilled in the art that, based upon the teachings of this disclosure, changes and modifications may be made without departing from the subject matter described in this disclosure and its broader aspects and, therefore, the appended claims are to encompass within their scope all such changes and modifications as are within the true spirit and scope of the subject matter described in this disclosure. Although particular embodiments of this disclosure have been illustrated, it is apparent that various modifications and embodiments of the disclosure may be made by those skilled in the art without departing from the scope and spirit of the disclosure.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. The disclosure is defined by the following claims, which should be construed to encompass one or more structures or function of one or more of the illustrative embodiments described above, equivalents and obvious variations. It will therefore be appreciated that the present invention provides significant improvements. The foregoing relates only to the exemplary embodiments of the present invention, and that numerous changes may be made therein without departing from the spirit and scope of the invention as defined by the following claims.

The invention claimed is:

1. A low-PIM cable support rail assembly, comprising:
a metal strut extending in a longitudinal direction;
a channel runner assembly slidably engaged with the strut comprising a low-PIM channel runner block and a metal threaded rod extending in a transverse direction from the channel runner block, a compression nut engaged with the threaded rod for releasably securing the channel runner assembly at a desired position along the strut;
a low-PIM polymeric spacer positioned between the strut and the compression nut;
wherein the low-PIM channel runner block and the low-PIM spacer prevent metal-to-metal contact between the threaded rod and the strut when the compression nut is tightened to secure the channel runner assembly at the desired position along the strut;
wherein the low-PIM channel runner block comprises a polymeric rod anchor retainer carrying a captured rod anchor engaged with the threaded rod.

2. The low-PIM cable support rail assembly of claim 1, further comprising one or more clips attaching the low-PIM spacer to the low-PIM channel runner block.

3. The low-PIM cable support rail assembly of claim 1, further comprising a cable support block attached to the threaded rod spaced apart from the strut in the transverse direction.

4. The low-PIM cable support rail assembly of claim 1, wherein the low-PIM channel runner block further comprises a polymeric retainer cap attached to the rod anchor retainer preventing the captured rod anchor from falling out of the rod anchor retainer.

5. A low-PIM cable support rail assembly, comprising:
a metal strut extending in a longitudinal direction;
a channel runner assembly slidably engaged with the strut comprising a low-PIM channel runner block and a metal threaded rod extending in a transverse direction from the channel runner block, a compression nut engaged with the threaded rod for releasably securing the channel runner assembly at a desired position along the strut;
a low-PIM polymeric spacer positioned between the strut and the compression nut;
wherein the low-PIM channel runner block and the low-PIM spacer prevent metal-to-metal contact between the threaded rod and the strut when the compression nut is tightened to secure the channel runner assembly at the desired position along the strut;
wherein the low-PIM channel runner block comprises a rod anchor embedded in a polymeric body.

6. The low-PIM cable support rail assembly of claim 1, a support structure positioning the low-PIM cable support rail within a potential PIM reactive zone of a cellular base station antenna.

7. The low-PIM cable support rail assembly of claim 1, wherein the strut is a first strut, further comprising:
a second strut carrying one or more additional channel runner assemblies;
a mounting bracket attaching the first and second struts to the mounting structure.

8. A low-PIM cable support rail assembly, comprising:
a strut elongated in a longitudinal direction comprising a channel comprising strut rails extending in the longitudinal direction defining a passage between the strut rails opening into the channel;
a channel runner assembly comprising a rod anchor retainer positioned within the channel, a captured rod anchor positioned within the rod anchor retainer, a retainer cap attached to the rod anchor retainer preventing the captured rod anchor from falling out of the rod anchor retainer, a threaded rod extending from the captured rod anchor through a hole in the rod anchor retainer and through the passage without touching the strut rails, a spacer positioned around the threaded rod and against the strut rails, and a compression nut engaged with the threaded rod for selectively tightening on the threaded rod to secure the strut rails between the spacer and the rod anchor retainer;
wherein the strut and the threaded rod are metallic, and wherein the rod anchor retainer, the retainer cap and the spacer are polymeric and positioned to prevent metal-to-metal contact between the strut, the captured rod anchor, and the threaded rod to mitigate passive intermodulation ("PIM") interference when the cable support rail assembly is positioned within a potential PIM reactive zone of a cellular base station antenna.

9. The low-PIM cable support rail assembly of claim 8, further comprising a low-PIM cable support block attached to the threaded rod spaced apart from the strut along the threaded rod.

10. The low-PIM cable support rail assembly of claim 8, wherein the rod anchor retainer comprises a hexagonal receptacle and the captured rod anchor has a hexagonal shape corresponding to the hexagonal receptacle.

11. The low-PIM cable support rail assembly of claim 8, wherein the rod anchor retainer, the retainer cap, and the spacer comprise glass-filled nylon.

12. The low-PIM cable support rail assembly of claim 8, further comprising a metal washer and a metal lock washer positioned around the threaded rod and between the compression nut and the spacer.

13. The low-PIM cable support rail assembly of claim 8, further comprising one or more clips integral with the spacer passing through the passage and removably attaching the spacer to the rod anchor retainer.

14. A low-PIM cable support rail assembly, comprising:
a strut elongated in a longitudinal direction comprising a first channel and a second channel on opposing sides of a divider wall, the first channel comprising first strut rails extending in the longitudinal direction defining a first passage between the first strut rails opening into the first channel, and the second channel comprising second strut rails extending in the longitudinal direction defining a second passage between the second strut rails opening into the second channel;
a first channel runner assembly comprising a first rod anchor retainer positioned within the first channel, a first captured rod anchor positioned within the first rod anchor retainer, a first threaded rod extending from the first captured rod anchor through a hole in the first rod anchor retainer and through the first passage without touching the first strut rails, a first spacer positioned around the first threaded rod and against the first rails, and a first compression nut engaged with the first threaded rod for selectively tightening on the first threaded rod to secure the first rails between the first spacer and the first rod anchor retainer;
a second channel runner assembly comprising a second rod anchor retainer positioned within the second channel, a second captured rod anchor positioned within the second rod anchor retainer, a second threaded rod extending from the second captured rod anchor through a hole in the second rod anchor retainer and through the second passage without touching the second strut rails, a second spacer positioned around the second threaded rod and against the second rails, and a second compression nut engaged with the second threaded rod for selectively tightening on the second threaded rod to secure the second rails between the second spacer and the second rod anchor retainer;
wherein the first strut and the first threaded rod are metallic, and wherein the first rod anchor retainer and the first spacer are polymeric and positioned to prevent metal-to-metal contact between the first strut, the first captured rod anchor, and the first threaded rod to mitigate passive intermodulation ("PIM") interference when the cable support rail assembly is positioned within a potential PIM reactive zone of a cellular base station antenna; and
wherein the second strut and the second threaded rod are metallic, and wherein the second rod anchor retainer and the second spacer are polymeric and positioned to prevent metal-to-metal contact between the second strut, the second captured rod anchor, and the second threaded rod to mitigate passive intermodulation ("PIM") interference when the cable support rail assembly is positioned within the potential PIM reactive zone of the cellular base station antenna.

15. The low-PIM cable support rail assembly of claim 14, further comprising a low-PIM cable support block attached to the first threaded rod spaced apart from the strut along the first threaded rod, wherein the second threaded rod is attached to a mounting structure.

16. The low-PIM cable support rail assembly of claim 14, wherein:
the first rod anchor retainer comprises a first hexagonal receptacle and the first captured rod anchor has a hexagonal shape corresponding to the first hexagonal receptacle;
the second rod anchor retainer comprises a second hexagonal receptacle and the second captured rod anchor has a hexagonal shape corresponding to the second hexagonal receptacle.

17. The low-PIM cable support rail assembly of claim 14, wherein the first rod anchor retainer, the first spacer, the second retainer, and the second spacer are polymeric.

18. The low-PIM cable support rail assembly of claim 14, wherein:
the first rod anchor retainer and the first spacer comprise glass-filled nylon;
the second rod anchor retainer and the second spacer comprise glass-filled nylon.

19. The low-PIM cable support rail assembly of claim 14, further comprising:
a first metal washer and a first metal lock washer positioned around the first threaded rod and between the first compression nut and the first spacer;
a second metal washer and a second metal lock washer positioned around the second threaded rod and between the second compression nut and the second spacer.

20. The low-PIM cable support rail assembly of claim 14, further comprising:
a first set of clips integral with the first spacer passing through the first passage and removably attaching the first spacer to the first rod anchor retainer;
a second set of clips integral with the second spacer passing through the second passage and removably attaching the second spacer to the second rod anchor retainer.

* * * * *